US010801933B2

(12) United States Patent
Zhang et al.

(10) Patent No.: US 10,801,933 B2

(45) Date of Patent: Oct. 13, 2020

(54) SELF-HEALING METHOD FOR FRACTURED SIC AMORPHOUS NANOWIRES

(71) Applicant: DALIAN UNIVERSITY OF TECHNOLOGY, Dalian, Liaoning Province (CN)

(72) Inventors: Zhenyu Zhang, Dalian (CN); Junfeng Cui, Dalian (CN); Leilei Chen, Dalian (CN); Dongming Guo, Dalian (CN)

(73) Assignee: DALIAN UNIVERSITY OF TECHNOLOGY, Dalian, Liaoning (CN)

( * ) Notice: Subject to any disclaimer, the term of this patent is extended or adjusted under 35 U.S.C. 154(b) by 90 days.

(21) Appl. No.: 16/339,689

(22) PCT Filed: Nov. 15, 2017

(86) PCT No.: PCT/CN2017/111167

§ 371 (c)(1),
(2) Date: Apr. 4, 2019

(87) PCT Pub. No.: WO2019/090798

PCT Pub. Date: May 16, 2019

(65) Prior Publication Data

US 2020/0018670 A1 Jan. 16, 2020

(30) Foreign Application Priority Data

Nov. 9, 2017 (CN) .......................... 2017 1 1094048

(51) Int. Cl.

*G01N 3/08* (2006.01)
*C01B 32/956* (2017.01)

(52) U.S. Cl.

CPC ............ *G01N 3/08* (2013.01); *C01B 32/956* (2017.08); *C01P 2004/04* (2013.01);

(Continued)

(58) Field of Classification Search

CPC ............ G01N 3/08; G01N 2203/0001; G01N 2203/0016; G01N 2203/005;

(Continued)

(56) References Cited

U.S. PATENT DOCUMENTS 8,684,595 B2 * 4/2014 Wardle ................ G01M 5/0033 374/45
2014/0309316 A1 * 10/2014 Lauterbach ............ B01J 37/031 518/709

(Continued)

FOREIGN PATENT DOCUMENTS

CN 101109687 A 1/2008
CN 101113946 A 1/2008

(Continued)

OTHER PUBLICATIONS

Zhang, Yuefei, et al. "Study on Atom-Scale Nanomechanics and Structure under In-Situ/Application Field", (Institute for Microstructure and Properties of Solid,Beijing University of Technology), Materials China, vol. 28, No. 1, Jan. 2009, pp. 15-25 (ISSN: 1674-3962).

*Primary Examiner* — Octavia Hollington

(74) *Attorney, Agent, or Firm* — Muncy, Geissler, Olds & Lowe, P.C.

(57) ABSTRACT

The present invention provides a self-healing method for fractured SiC amorphous nanowires. A goat hair in a Chinese brush pen of goat hair moves and transfers single crystal nanowires under an optical microscope. On an in-situ nanomechanical test system of a TEM, local single crystal nanowires are irradiated with an electron beam for conducting amorphization transformation. Amorphous length of a single crystal after transformation is 60-100 nm. A fracture strength test is conducted on the amorphous nanowires in the single crystal after transformation in the TEM; and fracture strength of the amorphous nanowires is 9-11 GPa. After the (Continued)

amorphous nanowires are fractured, unloading causes a slight contact between the fractured end surfaces; and self-healing of the nanowires is conducted after waiting for 16-25 min in a vacuum chamber of the TEM. Atom diffusion is found at a healed fracture through in-situ TEM representation; and recrystallization is found in the amorphous nanowires. The present invention provides a method for realizing self-healing for fractured SiC amorphous nanowires without external intervention.

1 Claim, 2 Drawing Sheets

(52) U.S. Cl.
CPC .. *C01P 2004/16* (2013.01); *G01N 2203/0001* (2013.01); *G01N 2203/005* (2013.01); *G01N 2203/0016* (2013.01); *G01N 2203/0067* (2013.01); *G01N 2203/028* (2013.01); *G01N 2203/0286* (2013.01)

(58) Field of Classification Search
CPC ... G01N 2203/0067; G01N 2203/0286; G01N 2203/028; C01B 32/956; C01P 2004/04; C01P 2004/16; H01L 29/0665
USPC ........................................................... 73/788
See application file for complete search history.

(56) References Cited

U.S. PATENT DOCUMENTS

2015/0255227 A1* 9/2015 Chen ...................... C08G 69/48 361/502
2015/0360408 A1* 12/2015 Menceloglu ......... D01D 5/0007 428/394
2018/0126456 A1* 5/2018 So ............................. C09C 1/44
2020/0080921 A1* 3/2020 Zhang ................... C01B 32/956

FOREIGN PATENT DOCUMENTS

CN 107219243 A 9/2017
WO 2011/053346 A1 5/2011

* cited by examiner

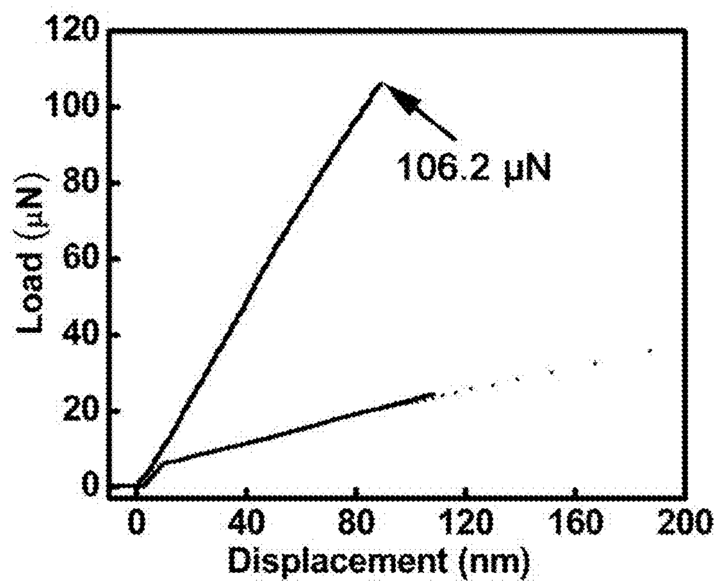
Fig. 1
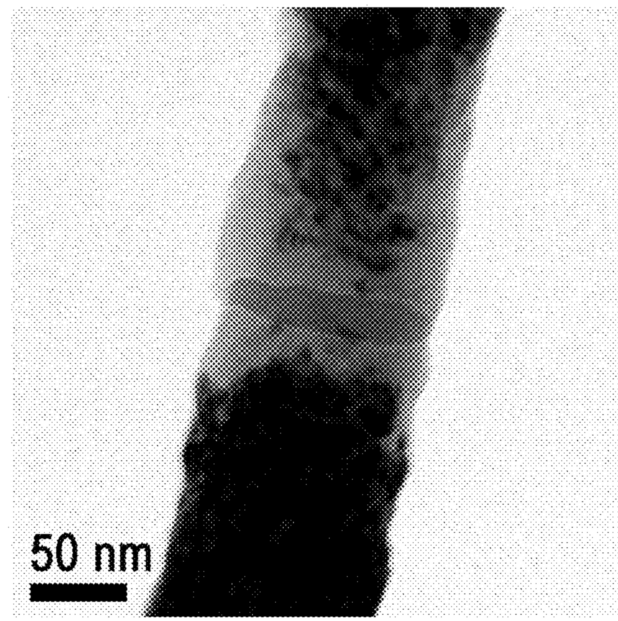
(Fig.2 as an illustration in Abstract)

SELF-HEALING METHOD FOR FRACTURED SiC AMORPHOUS NANOWIRES

TECHNICAL FIELD

A self-healing method for fractured SiC amorphous nanowires relates to long service life, reliability and stability of semiconductor devices and equipment, and particularly relates to long service life and high reliability of SiC single crystal and amorphous devices and equipment.

BACKGROUND

SiC has high heat transfer coefficient, high breakdown voltage and high band gap width, and is widely applied to the fields of high temperature and high energy. In the fields of high temperature and high energy, SiC has unique performance and advantages, has occupied a dominant position and becomes a typical third-generation semiconductor material. Amorphization transformation of SiC single crystal will occur under machining stress, nanoscratch and the irradiation of an electron beam and femtosecond laser. Therefore, a self-healing method for fractured SiC amorphous nanowires is an important guarantee for long service life and high reliability of SiC single crystal and amorphous devices and equipment, is a research hotspot and difficulty problem in interdisciplines of the fields of international advanced manufacture, mechanics, physics and material, and is widely concerned.

Current self-healing methods mainly focus on polymers and their composites, and a microinjection method is generally adopted. When the polymers and their composites are locally fractured, microcapsules inside will release healing agents to heal fractured positions, so as to prevent further crack propagation and ensure high reliability of the materials. However, the healing agents in this method can only be released once generally, and the manufacturing cost is expensive, manufacturing process is absent, and the performance of the materials will be affected. This method is mainly limited to the polymers and their composites. It is reported that the fracture of SiC can be repaired with SiO at 900-1300° C. which is similar to a welding method. Self-healing of semiconductors, ceramic materials and metal is mainly realized by high temperature, welding, coating, electrochemistry, electron beam irradiation, compression and other methods. These methods realize self-healing of fractured materials by means of an external intervention method. At present, self-healing without external intervention after solid fracture has not been reported internationally. The probability of material fracture of SiC is greatly increased because it works in harsh environments and extreme conditions such as high temperature and high energy. In many occasions, amorphous self-healing of SiC cannot be achieved by means of the external intervention mode. For example, in the fields of aviation, aerospace and nuclear energy, once externally shocked, SiC single crystal and crystal structure are subjected to amorphization transformation and are fractured. Failure to realize self-healing without external intervention may cause disastrous consequences.

SUMMARY

A self-healing method for fractured SiC amorphous nanowires realizes self-healing of amorphous nanowires without external intervention.

The present invention adopts the following technical solution:

A self-healing method for fractured SiC amorphous nanowires is provided. A goat hair in a Chinese brush pen of goat hair moves and transfers single crystal nanowires under an optical microscope; on an in-situ nanomechanical test system of a TEM, local single crystal nanowires are irradiated with an electron beam for conducting amorphization transformation; and amorphous length of a single crystal after transformation is 60-100 nm. A fracture strength test is conducted on the amorphous nanowires in the single crystal after transformation in the TEM; and fracture strength of the amorphous nanowires is 9-11 GPa. After the amorphous nanowires are fractured, unloading causes a slight contact between the fractured end surfaces; and self-healing of the nanowires is conducted after waiting for 16-25 min in a vacuum chamber of the TEM. Atom diffusion is found at a healed fracture through in-situ TEM representation; recrystallization is found in the amorphous nanowires; fracture strength of the amorphous nanowires after self-healing is 6-8 GPa; and the recovery ratio of the fracture strength is 50-70%. The present invention provides a method for realizing self-healing for fractured SiC amorphous nanowires without external intervention.

SiC single crystal nanowires have a diameter of 92-120 nm. A diameter of about 100 nm is a bridge that connects nanometer and submicron. To give consideration to the application of SiC in nanometer and micro fields, the diameter of SiC material is selected as 92-120 nm.

The tail end of a Chinese brush pen of goat hair is fixed to a mobile platform of an optical microscope, and the other end moves and transfers single crystal nanowires placed on the mobile platform under another optical microscope through a goat hair; and the single crystal nanowires are placed on a microtest apparatus of an in-situ TEM mechanical test system. The goat hair has good flexibility and has a tapered diameter, which is beneficial for moving and transferring the nanowires. One end of the Chinese brush pen of goat hair is fixed to the mobile platform of the optical microscope. Macroscopic and microcosmic movement of a single goat hair are realized through a coarse control knob and a fine control knob of the optical microscope. Movement and transfer operation for the nanowires is realized under another optical microscope through electrostatic attraction between the goat hair and the nanowires. The nanowires are placed on the microtest apparatus of the in-situ TEM nanomechanical test system.

Both ends of the nanowires are fixed to the microtest apparatus using conductive silver epoxy. The conductive silver epoxy can realize a conductive function, which is beneficial for imaging of the TEM. A single goat hair in the Chinese brush pen of goat hair is dipped in a small drop of conductive silver epoxy, and the conductive silver epoxy is respectively dropped on both ends of the nanowires. After the conductive silver epoxy is solidified in air, the nanowires can be installed on the in-situ TEM mechanical test system.

The microtest apparatus is installed on the in-situ nanomechanical test system of the TEM; local single crystal nanowires are irradiated with the electron beam in the TEM for conducting amorphization transformation; the irradiation density of the electron beam is 45-55 A/cm$^2$; irradiation time is 55-70 min; and amorphous length of a single crystal after transformation is 60-100 nm. SiC single crystal can realize amorphization transformation under the irradiation of the electron beam, thereby achieving that the single crystal nanowires contain local amorphous nanowires. Self-healing performance of fractured amorphous nanowires has a great influence on long service life and high reliability of SiC single crystal and amorphous devices and equipment. The density of the electron beam is 45-55 A/cm$^2$; and irradiation time is 55-70 min. The irradiation is at medium intensity. The length of SiC amorphous nanowires is 60-100 nm, so that the SiC single crystal contains local amorphous nanowires and conforms to the feature of amorphization transformation of the SiC single crystal device.

A fracture strength test is conducted on the amorphous nanowires in the single crystal after transformation in the TEM; a displacement control mode is used; loading rate is 1-10 nm/s; and displacement is 0-220 nm. Because the fracture strength of the single crystal is higher than that of the amorphous nanowires, the amorphous nanowires are often fractured. The displacement control mode is that the plastic deformation of SiC of hard and brittle materials is relatively small, so the displacement control is easy to realize fracture. The loading rate is 1-10 nm/s in order to obtain a high-resolution TEM micrograph of a tension test video. The displacement is 0-220 nm in order to fracture the amorphous nanowires, obtain amorphous fracture strength and prepare for self-healing of the amorphous nanowires.

The fracture strength of the amorphous nanowires is 9-11 GPa. The fracture strength is an in-situ TEM mechanical tension test result obtained by dividing a maximum force of fracturing the amorphous nanowires by a fracture area.

After the amorphous nanowires are fractured, unloading causes a slight contact between the fractured end surfaces; the load of the end surfaces is 0; the electron beam is shut off; and self-healing of the nanowires is conducted after waiting for 16-25 min in a vacuum chamber of the TEM. The fractured amorphous end surfaces come into slight contact. The load is confirmed as 0 by the in-situ mechanical system test. The electron beam is shut off. Without any external intervention, the fractured amorphous nanowires realize self-healing, and healing time is 16-25 min. Waiting without doing nothing else, complete self-healing without external intervention is realised.

After self-healing, a second fracture strength test is conducted on the nanowires in the TEM; a displacement control mode is used; loading rate is 1-10 nm/s; and displacement is 0-220 nm. After self-healing of the amorphous nanowires, the fracture strength test is conducted, which has an important influence on long service life and high reliability of SiC single crystal and amorphous devices and equipment. The loading rate is 1-10 nm/s in order to obtain a high-resolution TEM micrograph of a tension fracture video. The displacement is 1-220 nm in order to fracture the healed amorphous nanowires to obtain the fracture strength of the healed amorphous nanowires.

Atom diffusion is found at a healed fracture through in-situ TEM representation; recrystallization is found in the amorphous nanowires; thus, the strength of the healed fracture is higher than that of the amorphous nanowires; and a fracture position which is fractured after self-healing is different from the fracture before healing. By extracting the high-resolution TEM micrographs in loading and unloading videos, atom diffusion is found at the healed fracture and recrystallization is generated in the amorphous nanowires. The fracture strength of the SiC single crystal is higher than that of the amorphous nanowires; and the healed fracture contains a single crystal and amorphous mixed phase. Therefore, the strength is also higher than that of the amorphous nanowires, causing that the position of the fracture after self-healing is different from the position of the fracture before healing.

The fracture strength of the amorphous nanowires after self-healing is 6-8 GPa; and the recovery ratio of the fracture strength is 50-70%. The fracture strength of the amorphous nanowires is 9-11 GPa. The fracture strength of the amorphous nanowires after self-healing is 6-8 GPa. Therefore, the recovery ratio of the fracture strength is 50-70%. It indicates that the strength after self-healing may exceed over half of that of original amorphous nanowires, which is very important for long service life and high reliability of SiC single crystal and amorphous devices and equipment. A new thought and a new method are provided for design and manufacture of high-performance SiC devices and equipment.

The present invention has the effects and the benefits that the single crystal SiC is irradiated with the electron beam, realizing local amorphization transformation. No external intervention is needed after the amorphous nanowires are fractured, realizing self-healing for the amorphous nanowires.

DESCRIPTION OF DRAWINGS

FIG. 1 shows in-situ TEM tension loading and unloading curves of SiC amorphous nanowires.

FIG. 2 is a TEM micrograph of fractured SiC amorphous nanowires after self-healing.

DETAILED DESCRIPTION

Figure 3:
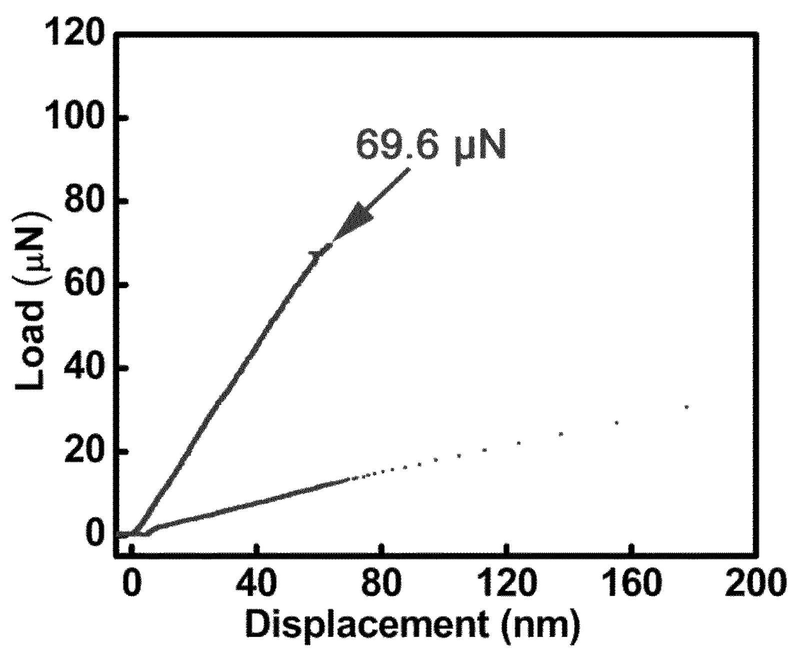
FIG. 3 shows in-situ TEM tension loading and unloading curves of SiC amorphous nanowires after self-healing.

Specific embodiments of the present invention are further described below in combination with accompanying drawings and the technical solution.

A self-healing method for fractured SiC amorphous nanowires realizing self-healing of amorphous nanowires without external intervention, wherein:

(1) SiC single crystal nanowires have a diameter of 92-120 nm;

(2) the tail end of a Chinese brush pen of goat hair is fixed to a mobile platform of an optical microscope, and the other end moves and transfers single crystal nanowires placed on the mobile platform under another optical microscope through a goat hair; and the single crystal nanowires are placed on a microtest apparatus of an in-situ TEM mechanical test system;

(3) both ends of the nanowires are fixed to the microtest apparatus using conductive silver epoxy;

(4) the microtest apparatus is installed on an in-situ TEM nanomechanical test system; local single crystal nanowires are irradiated with an electron beam in the TEM for conducting amorphization transformation; the irradiation density of the electron beam is 45-55 A/cm$^2$; irradiation time is 55-70 min; amorphous length of a single crystal after transformation is 60-100 nm;

(5) a fracture strength test is conducted on the amorphous nanowires in the single crystal after transformation in the TEM; a displacement control mode is used; loading rate is 1-10 nm/s; displacement is 0-220 nm;

(6) fracture strength of the amorphous nanowires is 9-11 GPa;

(7) after the amorphous nanowires are fractured, unloading causes a slight contact between the fractured end surfaces; the load of the end surfaces is 0; the electron beam is shut off; self-healing of the nanowires is conducted after waiting for 16-25 min in a vacuum chamber of the TEM;

(8) after self-healing, a second fracture strength test is conducted on the nanowires in the TEM; a displacement control mode is used; loading rate is 1-10 nm/s; displacement is 0-220 nm;

(9) atom diffusion is found at a healed fracture through in-situ TEM representation; recrystallization is found in the amorphous nanowires; thus, the strength of the healed fracture is higher than that of the amorphous nanowires; and a fracture position which is fractured after self-healing is different from the fracture before healing;

(10) the fracture strength of the amorphous nanowires after self-healing is 6-8 GPa; and the recovery ratio of the fracture strength is 50-70%.

Embodiments

SiC single crystal has a diameter of 95-110 nm and is used as the nanowire of amorphization transformation. The tail end of the Chinese brush pen of goat hair is bonded to an optical platform of the optical microscope using 502 glue. The goat hairs at the other end are tightened with thin copper wires, and one goat hair is set aside. The middle of the goat hairs is fixed using the thin copper wires. The front of the goat hairs is set aside, which is similar to a cantilever beam structure. The SiC single crystal nanowires are placed in an acetone solution for ultrasonic dispersion for 50-55 s. A 200-mesh copper grid having a plastic film and a diameter of 3 mm and used for preparing a TEM sample is used as a tool for placing the nanowires. The plastic film on the copper grid is burned out through a candle. Then, the copper grid is clamped with tweezers for conducting ultrasonic cleaning in the acetone solution for 15-25 s. After cleaning is completed, the cleaned copper grid is clamped with the tweezers to gain nanowires from the acetone solution with diffused nanowires. Then, the copper grid is placed on the mobile platform of another optical microscope, and the optical microscope is focused clearly to see the nanowires. A single goat hair similar to a cantilever beam realizes macroscopic and microcosmic movement under the combination of coarse control and fine control of the optical microscope by means of the optical microscope platform fixed to the tail end. The goat hair is inserted into the lower part of the nanowires. The nanowires are lifted through electrostatic attraction to leave the copper grid. Movement and transfer of the nanowires are realized through the electrostatic attraction between the goat hair and the nanowires. A micro apparatus of the in-situ TEM mechanical test system is used to replace the copper grid to place the nanowires in the tension position of the micro test apparatus. The goat hair is dipped in a small drop of conductive silver epoxy, respectively placed on both ends of the nanowires and solidified in air. Then, the micro apparatus with the nanowires is placed in the in-situ nanomechanical test system of PI 95 TEM PicoIndenter. The system is inserted into FEI Tecnai F20 FETEM. Local SiC single crystal nanowires are irradiated with an electron beam with an electron energy density of 50.06 A/cm$^2$ and irradiation time is 60 min. Thus, the irradiated SiC single crystal nanowires generate amorphization transformation, and the length of the amorphization part is 60-90 nm. The fracture strength test is conducted on the SiC amorphous nanowires; a displacement control mode is used; loading rate is 5 nm/s; and displacement is 0-200 nm. Loading and unloading curves are shown in FIG. 1. After the test, the fracture strength of the amorphous nanowires is 10 GPa. After unloading, the fractured amorphous end surfaces come into slight contact; the load is 0; the electron beam is shut off; and self-healing of the amorphous nanowires is conducted after waiting for 20 min in the vacuum chamber of the TEM. After 20 min, the electron beam is turned on to in-situ shoot a high-resolution TEM micrograph of the fracture of the amorphous nanowires after self-healing, as shown in FIG. 2. It is proved through the TEM micrograph of atomic dimension that atom diffusion is generated at the healed fracture of the amorphous nanowires, recrystallization is formed in the amorphous nanowires and the healed fracture is composed of amorphous phase and crystal phase. A displacement control mode is used. The fracture strength test is conducted on the amorphous nanowires after self-healing. The loading rate is 5 nm/s; and displacement is 0-200 nm. Loading and unloading curves of the fracture strength test of the amorphous nanowires after self-healing are shown in FIG. 3. Because the fracture strength of the SiC single crystal is higher than that of the amorphous nanowires, the amorphous nanowires are fractured. The fracture after self-healing contains the crystal and amorphous nanowires. The strength is higher than that of the amorphous nanowires, causing that the amorphous fracture after self-healing and the fracture before healing are not in the same place. The fracture strength of the amorphous nanowires after self-healing is 6.7 GPa; and the recovery ratio of the fracture strength of the amorphous nanowires is 67%.

We claim:

1. A self-healing method for fractured SiC amorphous nanowires, realizing self-healing of amorphous nanowires without external intervention, wherein:

(1) SiC single crystal nanowires have a diameter of 92-120 nm;

(2) the tail end of a Chinese brush pen of goat hair is fixed to a mobile platform of an optical microscope, and the other end moves and transfers single crystal nanowires placed on the mobile platform under another optical microscope through a goat hair; the single crystal nanowires are placed on a microtest apparatus of an in-situ TEM mechanical test system;

(3) both ends of the nanowires are fixed to the microtest apparatus using conductive silver epoxy;

(4) the microtest apparatus is installed on an in-situ TEM nanomechanical test system; local single crystal nanowires are irradiated with an electron beam in the TEM for conducting amorphization transformation; the irradiation density of the electron beam is 45-55 A/cm$^2$; irradiation time is 55-70 min; amorphous length of a single crystal after transformation is 60-100 nm;

(5) a fracture strength test is conducted on the amorphous nanowires in the single crystal after transformation in the TEM; a displacement control mode is used; loading rate is 1-10 nm/s; displacement is 0-220 nm;

(6) fracture strength of the amorphous nanowires is 9-11 GPa;

(7) after the amorphous nanowires are fractured, unloading causes a slight contact between the fractured end surfaces; the load of the end surfaces is 0; the electron beam is shut off; self-healing of the nanowires is conducted after waiting for 16-25 min in a vacuum chamber of the TEM;

(8) after self-healing, a second fracture strength test is conducted on the nanowires in the TEM; a displacement control mode is used; loading rate is 1-10 nm/s; displacement is 0-220 nm;

(9) atom diffusion is found at a healed fracture through in-situ TEM representation; recrystallization is found in the amorphous nanowires; thus, the strength of the healed fracture is higher than that of the amorphous nanowires; a fracture position which is fractured after self-healing is different from the fracture before healing;

(10) fracture strength of the amorphous nanowires after self-healing is 6-8 GPa; and the recovery ratio of the fracture strength is 50-70%.

* * * * *